United States Patent
Nakabayashi

(10) Patent No.: US 10,468,571 B2
(45) Date of Patent: Nov. 5, 2019

(54) LIGHT DISTRIBUTION METHOD FOR ADAPTIVE DRIVING BEAM HEADLAMP SYSTEM, AND ADAPTIVE DRIVING BEAM HEADLAMP SYSTEM

(71) Applicant: NICHIA CORPORATION, Anan-shi, Tokushima (JP)

(72) Inventor: Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/260,243

(22) Filed: Jan. 29, 2019

(65) Prior Publication Data

US 2019/0157536 A1     May 23, 2019

Related U.S. Application Data

(63) Continuation of application No. 15/657,354, filed on Jul. 24, 2017, now Pat. No. 10,256,386, which is a
(Continued)

(30) Foreign Application Priority Data

Oct. 31, 2014    (JP) ................................ 2014-222249
Sep. 25, 2015    (JP) ................................ 2015-187821

(51) Int. Cl.
*H01L 33/62*      (2010.01)
*H05K 1/11*       (2006.01)
(Continued)

(52) U.S. Cl.
CPC ............ *H01L 33/62* (2013.01); *B60Q 1/1423* (2013.01); *B60Q 1/16* (2013.01); *F21S 41/143* (2018.01);
(Continued)

(58) Field of Classification Search
None
See application file for complete search history.

(56) References Cited

U.S. PATENT DOCUMENTS 8,045,760 B2 * 10/2011 Stam .................... B60Q 1/1423
                                                                        340/457.2
8,921,869 B2     12/2014 Welch et al.
(Continued)

FOREIGN PATENT DOCUMENTS

CN        101604724 A    12/2009
CN        103228074 A     7/2013
(Continued)

OTHER PUBLICATIONS

Extended European Search Report of the corresponding European Patent Application No. 15192107.9, dated Apr. 6, 2016.
(Continued)

*Primary Examiner* — Minh D A
*Assistant Examiner* — James H Cho
(74) *Attorney, Agent, or Firm* — Global IP Counselors, LLP

(57) ABSTRACT

A light distribution method is for an adaptive driving beam headlamp system including a light emitting device, an on-board camera and an electronic control unit. The light distribution method includes: obtaining data indicative of a state in front of a vehicle by the on-board camera; computing one or more of: attributes of an object in front of the vehicle; attributes of a vehicle ahead; a speed of the vehicle ahead; a distance between vehicles; brightness of the object; and a road shape; determining a light distribution pattern; determining a control amount indicative of at least one of an ON or OFF state of each of the light emitting elements and an applied power to each of the light emitting elements according to the light distribution pattern determined; and control-
(Continued)

ling driving of the adaptive driving beam headlamp system based on the control amount determined.

17 Claims, 15 Drawing Sheets

Related U.S. Application Data continuation of application No. 14/924,831, filed on Oct. 28, 2015, now Pat. No. 9,722,160.

(51) Int. Cl.

| | |
|---|---|
| B60Q 1/14 | (2006.01) |
| B60Q 1/16 | (2006.01) |
| H01L 33/08 | (2010.01) |
| H01L 33/54 | (2010.01) |
| H01L 33/38 | (2010.01) |
| H05K 1/02 | (2006.01) |
| F21Y 105/12 | (2016.01) |
| F21Y 105/10 | (2016.01) |
| H01L 25/075 | (2006.01) |
| H01L 33/10 | (2010.01) |
| F21S 41/143 | (2018.01) |
| F21S 41/14 | (2018.01) |
| F21S 41/663 | (2018.01) |

(52) U.S. Cl.
CPC ............ *F21S 41/18* (2018.01); *F21S 41/663* (2018.01); *H01L 25/0753* (2013.01); *H01L 33/08* (2013.01); *H01L 33/10* (2013.01); *H01L 33/54* (2013.01); *H05K 1/111* (2013.01); *B60Q 2300/42* (2013.01); *B60Q 2300/45* (2013.01); *F21Y 2105/10* (2016.08); *F21Y 2105/12* (2016.08); *H01L 33/38* (2013.01); *H01L 2224/16225* (2013.01); *H01L 2924/0002* (2013.01); *H01L 2924/181* (2013.01); *H01L 2924/18161* (2013.01); *H05K 1/0287* (2013.01); *H05K 2201/09663* (2013.01); *H05K 2201/10106* (2013.01); *Y02P 70/611* (2015.11)

(56) References Cited

U.S. PATENT DOCUMENTS

| | | | | |
|---|---|---|---|---|
| 9,436,880 | B2 * | 9/2016 | Bos | .................. B60N 2/002 |
| 9,722,160 | B2 | 8/2017 | Nakabayashi | |
| 2006/0238326 | A1 | 10/2006 | Repetto et al. | |
| 2008/0258158 | A1 | 10/2008 | Yoneda et al. | |
| 2009/0050994 | A1 | 2/2009 | Ishihara et al. | |
| 2009/0309514 | A1 | 12/2009 | Kim | |
| 2010/0219431 | A1 | 9/2010 | Hasnain et al. | |
| 2012/0001547 | A1 | 1/2012 | Nishitani et al. | |
| 2012/0018623 | A1 | 1/2012 | Dinc et al. | |
| 2012/0049236 | A1 | 3/2012 | Kamiya et al. | |
| 2012/0112227 | A1 | 5/2012 | Toyama | |
| 2012/0249436 | A1 | 10/2012 | Choi et al. | |
| 2013/0002148 | A1 | 1/2013 | Kim | |
| 2013/0188375 | A1 | 7/2013 | Masuda et al. | |
| 2013/0193862 | A1 | 8/2013 | Sasano | |
| 2013/0242100 | A1 | 9/2013 | Seki | |
| 2013/0320870 | A1 | 12/2013 | Oyaizu | |
| 2013/0329440 | A1 | 12/2013 | Tsutsumi et al. | |
| 2014/0062315 | A1 | 3/2014 | Tischler et al. | |
| 2014/0202752 | A1 | 7/2014 | Akahoshi | |
| 2014/0335635 | A1 | 11/2014 | Venk et al. | |
| 2015/0155459 | A1 * | 6/2015 | Ishihara | .............. H01L 25/0753 362/294 |
| 2016/0380155 | A1 * | 12/2016 | Jeong | ...................... H01L 33/22 257/101 |

FOREIGN PATENT DOCUMENTS

| | | |
|---|---|---|
| DE | 102009006184 A1 | 7/2010 |
| EP | 1983571 A2 | 10/2008 |
| EP | 2620696 A2 | 7/2013 |
| EP | 2636946 A2 | 9/2013 |
| EP | 2677232 A1 | 12/2013 |
| JP | S62-215289 A | 9/1987 |
| JP | S636759 Y | 2/1988 |
| JP | 2006-301650 A | 11/2006 |
| JP | 2008-288552 A | 11/2008 |
| JP | 2009-135535 A | 6/2009 |
| JP | 2009-302542 A | 12/2009 |
| JP | 2010-219324 A | 9/2010 |
| JP | 2011-114154 A | 6/2011 |
| JP | 3169479 U | 7/2011 |
| JP | 2012-49366 A | 3/2012 |
| JP | 2012-151436 A | 8/2012 |
| JP | 2012-165016 A | 8/2012 |
| JP | 2012-169189 A | 9/2012 |

OTHER PUBLICATIONS

Non Final Office Action of the U.S. Appl. No. 14/924,831, dated Jul. 5, 2016.
Notice of Allowance of the U.S. Appl. No. 14/924,831, dated Nov. 22, 2016.
Notice of Allowance (2nd) of the U.S. Appl. No. 14/924,831, dated Mar. 24, 2017.
Non Final Office Action of the U.S. Appl. No. 15/657,354, dated Oct. 6, 2017.
Final Office Action of the U.S. Appl. No. 15/657,354, dated May 24, 2018.
Notice of Allowance of the U.S. Appl. No. 15/657,354, dated Sep. 28, 2018.

* cited by examiner

LIGHT DISTRIBUTION METHOD FOR ADAPTIVE DRIVING BEAM HEADLAMP SYSTEM, AND ADAPTIVE DRIVING BEAM HEADLAMP SYSTEM

CROSS-REFERENCE TO RELATED APPLICATIONS

This is a continuation application of U.S. patent application Ser. No. 15/657,354 filed on Jul. 24, 2017, which is a continuation application of U.S. patent application Ser. No. 14/924,831 filed on Oct. 28, 2015, now U.S. Pat. No. 9,722,160. This application claims priority to Japanese Patent Application No. 2014-222249 filed on Oct. 31, 2014, and No. 2015-187821 filed on Sep. 25, 2015. The entire disclosures of U.S. patent application Ser. Nos. 15/657,354 and 14/924,831, and Japanese Patent Application Nos. 2014-222249 and 2015-187821 are hereby incorporated herein by reference.

BACKGROUND

1. Technical Field

The present disclosure relates to a light distribution method for an adaptive driving beam headlamp system, and an adaptive driving beam headlamp system.

2. Description of Related Art

With a light emitting device featuring light emitting diodes (LEDs) or other such light emitting elements, a plurality of light emitting elements are mounted on an insulated substrate on which matrix wiring has been formed. As a result, high brightness is obtained, and such devices have been utilized as automotive light sources and the like in recent years.

However, in the case of forming a matrix wiring on a substrate, particularly in order to individually turn on and off each of a plurality of light emitting elements, usually, a multilayer wiring is required, resulting in a complicated configuration, which requires complex manufacturing process and higher manufacturing costs. Also, this results in an increase in the size of the substrate, obstructing the miniaturization of the light emitting device.

The product of clamping, affixing, or otherwise attaching a thin-film wiring pattern to a green sheet of aluminum oxide or another such ceramic and then firing has been used in the past as a multilayer wiring or inner layer wiring board, for example, JP2009-135535A. However, with a light source in which high-density mounting is required in order to achieve high brightness, such as with an automotive light source, the width, pitch, and so forth of the wiring pattern need to be microminiaturized, and a decrease in the dimensional accuracy of a wiring pattern caused by shrinkage accompanying the firing of a ceramic makes it difficult to design the wiring of a matrix board.

Also, while various kinds of matrix wiring have been proposed for light emitting devices, for example, JP2009-302542A, a light emitting device needs to be designed that corresponds to the wiring pattern of the wiring board in order to adequately ensure the performance of the individual light emitting elements.

SUMMARY

An object of the present disclosure is to provide a light emitting device and an adaptive driving beam headlamp system with which individual turning on and off is possible, while the performance of the light emitting elements can be fully realized.

A light distribution method is for an adaptive driving beam headlamp system including a light emitting device, an on-board camera and an electronic control unit. The light emitting device includes: a substrate having a first main surface; a plurality of first wiring members formed on the first main surface; a plurality of second wiring members formed on the first main surface; and a plurality of light emitting elements each including a first electrode, a second electrode, and a semiconductor stacked-layer structure, with the first electrode and the second electrode being disposed on the same face side of the semiconductor stacked-layer structure, the first electrode facing and being connected to a corresponding one of the first wiring members, the second electrode having a first connection part and a second connection part electrically connected to each other with electrode material, and the first connection part and the second connection part respectively facing at least two of the second wiring members and bridging the at least two of the second wiring members. The light distribution method includes: obtaining data indicative of a state in front of a vehicle by the on-board camera; computing, based on the data obtained, one or more of: attributes of an object in front of the vehicle; attributes of a vehicle ahead; a speed of the vehicle ahead; a distance between vehicles; brightness of the object; and a road shape; determining a light distribution pattern based on a computed data; determining a control amount indicative of at least one of an ON or OFF state of each of the light emitting elements and an applied power to each of the light emitting elements according to the light distribution pattern determined; and controlling driving of the adaptive driving beam headlamp system based on the control amount determined.

The present disclosure can provide a method utilizing a light emitting device with which a smaller size is achieved with a simple structure, and individual turning on and off is possible while achieving sufficient performance of the light emitting elements.

Furthermore, the present disclosure can provide a high-performance adaptive driving beam headlamp system.

DETAILED DESCRIPTION OF THE EMBODIMENTS

Figure 1A:
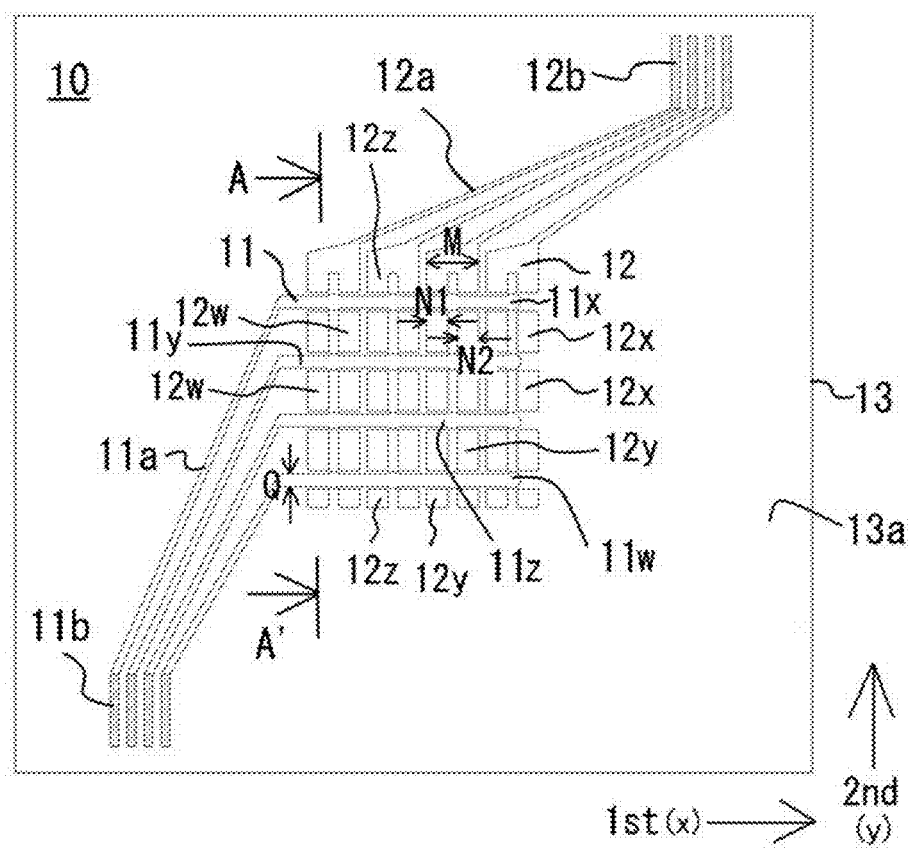
FIG. 1A is a simplified plan view of a drive substrate in an embodiment of the light emitting device disclosed herein.

The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted.

Light Emitting Device

The light emitting device of this embodiment has a drive substrate that includes a substrate having a first main surface, a plurality of first wiring that extend in a first direction, and a plurality of second wiring that are formed on the first main surface, extend in a second direction, and are segmented in their layout, as well as a plurality of light emitting elements that are mounted on this drive substrate and are equipped with a first electrode and a second electrode disposed on the same face side of a semiconductor stacked-layer structure.

Drive Substrate

Substrate

The substrate has a first main surface. Preferably, the substrate also has a second main surface as a main surface on the opposite side from the first main surface. The first main surface and/or the second main surface is preferably flat. The shape of the substrate is preferably that of a rectangular flat board, for example.

The thickness and size of the substrate can be suitably adjusted according to the size, number, and so forth of the light emitting elements to be mounted. For instance, the thickness of the substrate may be about 0.05 to 10 mm, with about 0.1 to 1 mm being preferable. An example of the size is from about 50×50 mm to 100×100 mm.

The substrate may be formed from a material with insulating properties, examples thereof include alumina, aluminum nitride and other such ceramic substrates, glass substrates, glass epoxy substrates, paper phenol substrates, paper epoxy substrates, glass composite substrates, low-temperature co-fired ceramic (LTCC) substrates, thermoplastic resin, thermosetting resin and other such resin substrates. Of these, a ceramic substrate is preferable, and a substrate composed of aluminum nitride is more preferable from the standpoint of heat dissipation. Also, the thermal conductivity is preferably at least 170 W/m·K.

The substrate preferably has a single-layer structure, and a ceramic substrate with a single-layer structure is particularly preferable. However, in the manufacturing process, two or more layers may be stacked and finally integrated to produce the substrate.

When a ceramic substrate is used, it may be manufactured by a co-firing method, but a post-firing method is preferable in order to obtain a substrate with better dimensional accuracy. Post-firing is a method in which wiring is formed on a ceramic board that has already been fired. When wiring is formed by post-firing, a fine pattern can be formed by plating, sputtering, vacuum vapor deposition, or the like involving lift-off with a mask pattern, by a photolithographic technique.

First Wiring and Second Wiring

The first and second wiring are formed on the first main surface of the substrate.

The first and second wiring are, for example, electrically connected to the light emitting elements and an external power source, and are used to apply voltage from the external power source to the light emitting elements. As will be discussed below, the first wiring are connected to the first electrodes of the light emitting elements, and the second wiring are connected to the second electrodes of the light emitting elements. The first wiring and the second wiring may correspond to either an anode or a cathode, but the first wiring preferably correspond to cathode, and the second wiring to anode.

There are a plurality of independent first wiring disposed extending in the first direction on the first main surface of the substrate. The "first direction" here may be any direction, but can be, for example, a direction corresponding to the x axis in two dimensions (such as the row direction). The concept of extending in the first electrode is not limited to extending linearly (such as 11 in FIG. 1A and 21 in FIG. 3A), and also encompasses extending toward the first direction in a stepped shape (41 in FIG. 5A), a curved shape, or a combination thereof. As long as single first wiring extends in the first direction, the first wiring may be partially branched (branching in two, in three (31 in FIG. 4A), etc.), or may have a part that is partially branched. The branched first wiring are preferably adjacent to each other and extend substantially in parallel.

Figure 3A:
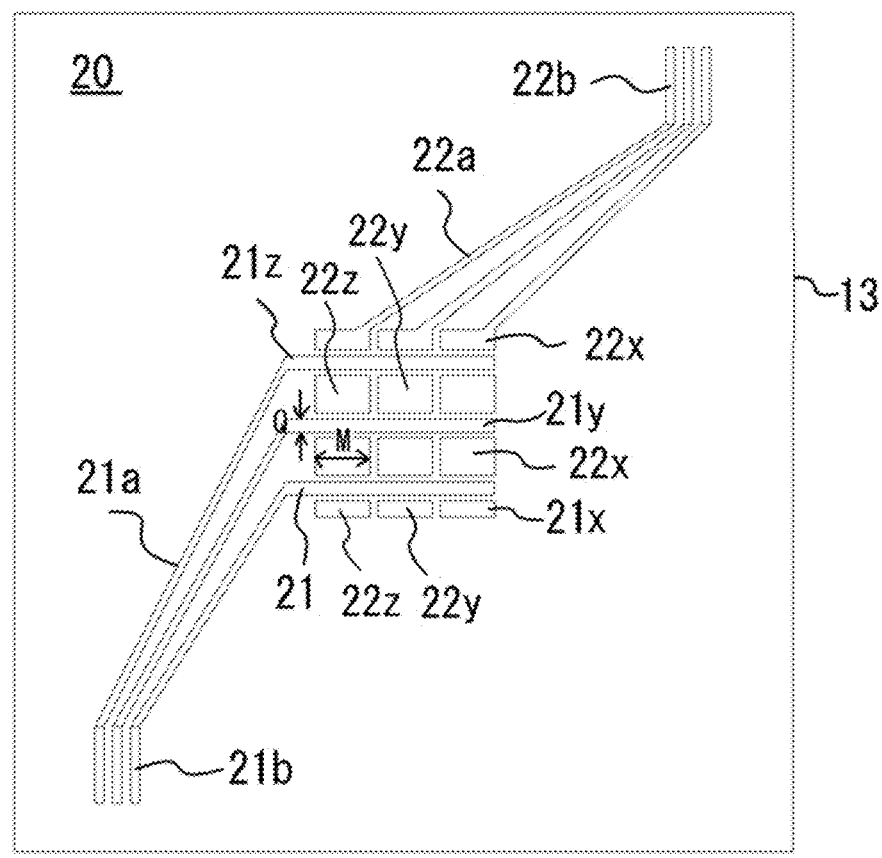
FIG. 3A is a simplified plan view showing an example of the drive substrate according to an embodiment of the present invention.
Figure 4A:
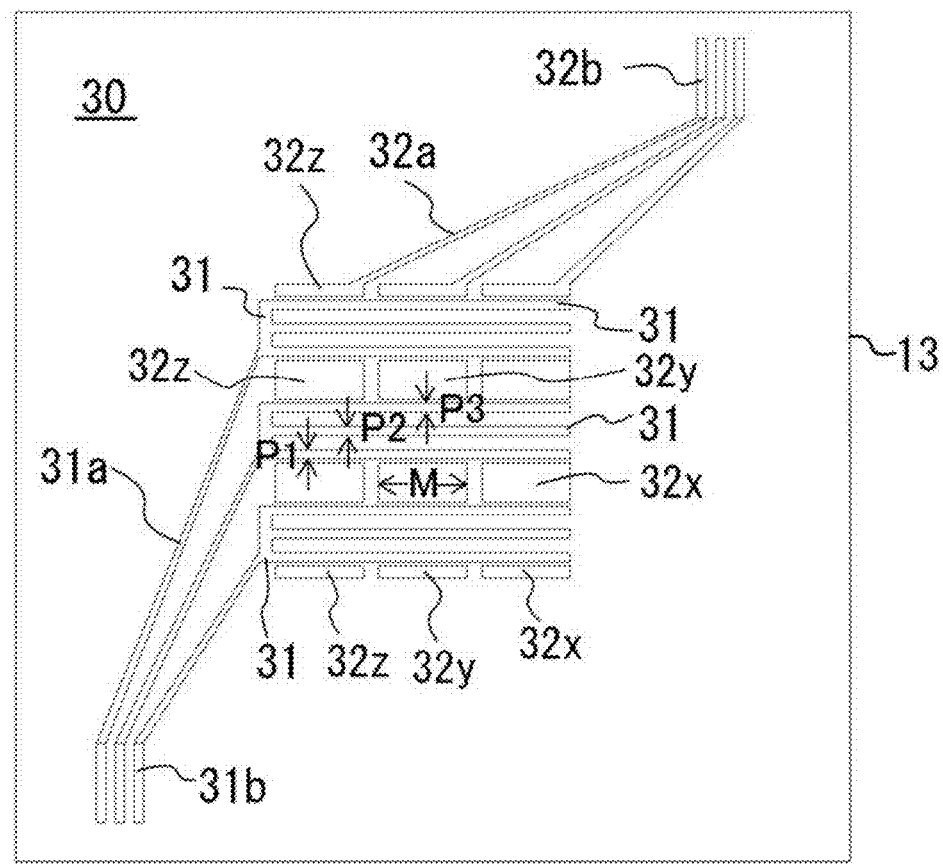
FIG. 4A is a simplified plan view showing an example of the drive substrate according to an embodiment of the present invention.
Figure 5A:
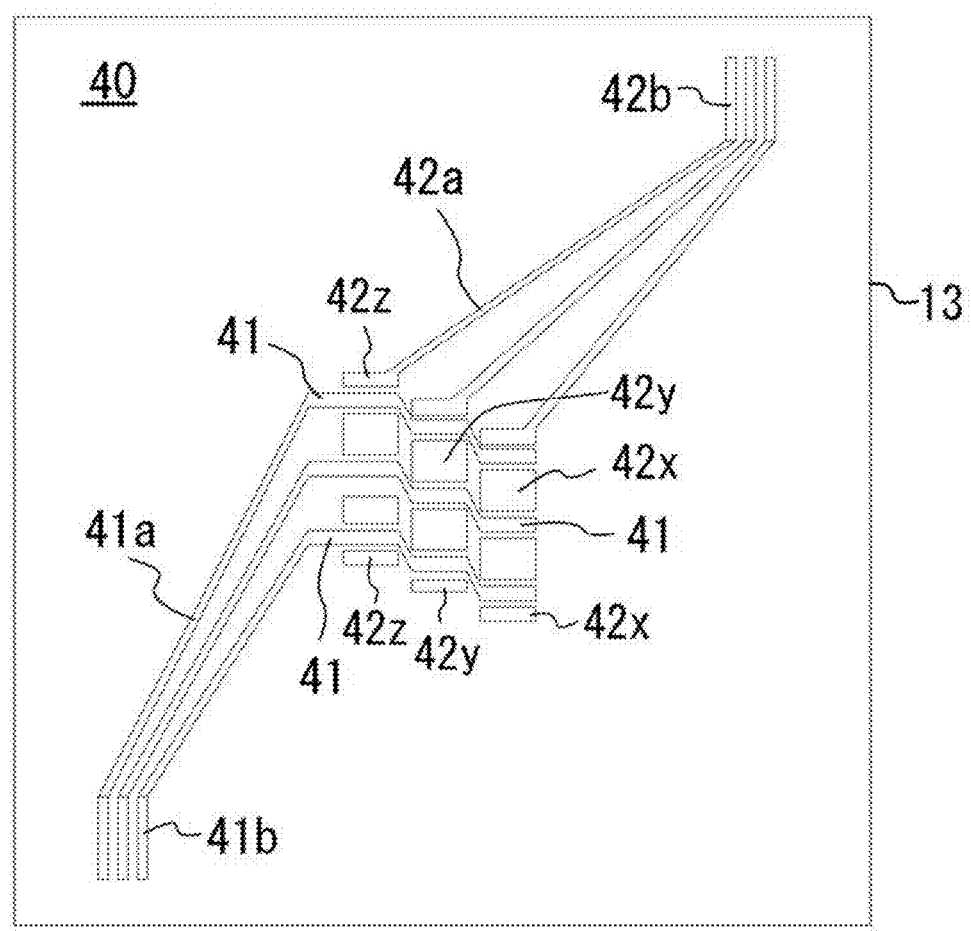
FIG. 5A is a simplified plan view showing an example of the drive substrate according to an embodiment of the present invention.

The second wiring extend in the second direction on the first main surface of the substrate, and are segmented in to a plurality of second wiring portions (such as 22x . . . in FIG. 3A), and a plurality of these second wiring are preferably disposed independently from each other (such as 22x, 22y, and 22z in FIG. 3A, 32x, 32y, and 32z in FIG. 4A, and 42x, 42y, and 42z in FIG. 5A). The second direction here may be any direction as long as it intersects the first wiring extending in the first direction. The angle of this intersection preferably be a perpendicular direction (such as the column direction, corresponding to the y axis). However, the term perpendicular here means that variance of about ±10° is permissible. Also, the concept of being disposed along the second direction is not limited to being disposed on a straight line, and also encompasses being disposed on a line that is stepped, curved, or a combination of these shapes when such a line extends toward the second direction.

The term "a plurality of" here means that a plurality of second wiring are disposed so as to make pairs with the plurality of first wiring. Also, when the second wiring extend along the second direction, they will usually intersect the first wiring at one or more places, but at the places corresponding to these intersection points, the second wiring are disposed not intersecting with the first wiring, but separated from the first wiring. In other words, since the second wiring are segmented and disposed at the locations corresponding to the sites of intersection with the first wiring, this can also mean that a single second wiring that forms a pair with a single first wiring is constituted by a plurality of segmented pieces (segmented second wiring portions). As long as a single second wiring is disposed along the second direction, the second wirings may be disposed in parallel and adjacent to each other so as to correspond to branching in two (12 in FIG. 1A), branching in three, etc. There may also be parts that are partially branched.

The outer peripheries of the first wiring and the second wiring are preferably arranged in a regular pattern in the column and row directions so as to create a square shape, rectangular shape, diamond shape, or the like, for example.

The first and second wiring can be formed from a material that conducts electricity, such as a single-layer film or stacked film of gold (Au), silver (Ag), copper (Cu), tungsten (W), nickel (Ni) or another such metal or alloy. The thickness of the first and second wiring may each have the same thickness overall, or may be partially different in their thickness. The total thickness of the first wiring and the second wiring is about 1 to 100 µm, for example.

In the case of forming the first wiring and/or the second wiring with a stacked film, the first wiring and/or the second wiring may have partially different structures in a direction of thickness or in-plane. For example, part of the surface of the first wiring or the second wiring is remover by laser trimming, and an exposed surface of the first wiring or the second wiring thus obtained may be converted to the oxide. More specifically, in the case where the first wiring or the second wiring is formed with a stacked structure of TiW/Cu/Ni/Au, the Au may be removed by laser trimming to expose the Ni, and the exposed surface of the Ni may be oxidized.

The width and spacing of the first and second wiring can be suitably adjusted according to the size, number, density, brightness, and so forth of the light emitting elements that are mounted on the drive substrate to be obtained. For instance, the width of the first wiring is preferably about at least one fifth to less than one half the length of one side of a light emitting element. In case where two or more first wiring are arranged for each light emitting element, their combined width may be about within this range. The width of the second wiring is preferably more than one fifth and no more than about one half the length of one side of a light emitting element. In case where two or more second wiring are arranged for each light emitting element, their combined width may be about within this range. It is particularly preferred for the second wiring to be wider than the first wiring. The term "wider" here means that the length of the second wiring in the first direction (M in FIG. 1A), or, in case where the second wiring is branched, the combined width of the branches (N1+N2 in FIG. 1A), is greater than the length of the first wiring in the second direction (Q in FIG. 1A). This also means that in case where the first wiring is branched, the width of the second wiring (M in FIG. 4A) is greater than the combined length of the branches of the first wirings in the second direction (P1+P2+P3 in FIG. 4A).

Thus making the second wiring wider than the first wiring allows the heat produced in the light emitting layer during emission to be effectively released by the wider second wiring. That is, the region in the light emitting element (discussed below) in which there is a second conduction layer connected via a second electrode is the region in which the light emitting layer is present, and heat is generated there during emission. Thus, when this heat is released first by the second conduction layer, then by the second electrode, and then by the second wiring, it can be dissipated more effectively if the second wiring is wider.

The first wiring and the second wiring are disposed separated from each other on the first main surface of the substrate. In other words, they are not disposed three-dimensionally, and instead are preferably formed by the same layer. Therefore, the two are preferably formed from the same metal material, that is, by a single layer or a stacked layer of the same metal or alloy. For example, they are preferably formed at the same time by metal layers of the same composition using a mask pattern.

The first main surface of the substrate may further include pad electrodes for connecting to electronic parts such as connectors, routing wirings for leading the above-mentioned first wiring and second wiring in the end direction of the substrate. With such routing wirings, etc., electrical connection to an external power source via connectors or other such electronic parts mounted on the substrate can be established, for example. The pad electrodes are preferably formed wider than the routing wirings.

With a drive substrate thus configured, matrix wiring can be formed in a single-layer structure over a single-layer substrate. Thus, a plurality of light emitting elements can be mounted at high density by varying the width, length, spacing, and so forth of the wiring as desired. In particular, since there is no need to form the so-called matrix wiring with a multilayer structure, it can be thinner and smaller in size. Also, since the steps involved in manufacturing this drive substrate are extremely simple, not only does this help prevent an increase in the manufacturing cost, but shrinkage of the substrate can also be avoided, and a drive substrate of good precision can be obtained. Furthermore, because a single-layer structure is used, even though the light emitting elements are disposed at high density, the heat attributable to heat generation by the light emitting elements will not be trapped inside the substrate, and will instead be quickly released from the front and back sides of the substrate, so heat dissipation is even better.

Also, with this drive substrate, particularly because each second wiring is segmented by the first wiring, in that state the plurality of second wiring are not electrically connected together. However, as will be discussed below, in case where light emitting elements are mounted so as to bridge segmented second wirings, the segmented wirings can be linked to each other. Thus, a plurality of second wirings that are electrically connected are disposed paired up with the first wiring. As a result, a drive substrate can be obtained in which a plurality of light emitting elements can be drive-controlled independently of each other.

Light Emitting Elements

Light emitting diodes are preferably used as the light emitting elements. The light emitting elements has, for example, a semiconductor stacked-layer structure including a first conduction layer, a light emitting layer, and a second conduction layer, formed by any of various semiconductors such as InN, AlN, GaN, InGaN, AlGaN, InGaAlN, and other such nitride semiconductors, III-V-group compound semiconductors, II-VI-group compound semiconductors, and so forth, on a substrate, and a first electrode and second electrode are also formed. Examples of the substrate of the light emitting elements include sapphire and other such insulating substrates, and SiC, silicon, GaN, GaAs, and other such conductive substrates. However, ultimately, the light emitting elements need not have these substrates, and the substrate may be removed after the stacking of the semiconductor layer.

First Electrode and Second Electrode

The first electrode and the second electrode are connected to the first conduction layer and the second conduction layer, respectively, but usually it is preferable if the first electrode is connected on the first conduction layer exposed by removal of part of the second conduction layer and the light emitting layer stacked over the first conduction layer, the second electrode is connected on a second conduction-type semiconductor layer, and the first electrode and the second electrode are disposed on the same face side of the stacked-layer structure. The first conduction layer is preferably n type, and the second conduction layer p type.

The first electrode and the second electrode are usually disposed on the inside of the light emitting elements in plan view. The position and size of the first and second electrodes are preferably adjusted to a position and size that afford reliable connection to the first wiring and the second wiring of the drive substrate.

For example, the first electrode is preferably disposed in the center portion of the light emitting elements, and the second electrode is disposed so as to surround the first electrode. The first wiring connected to the first electrode is disposed sandwiching the segmented second wiring, so the first electrode preferably has a width that is the same as or less than that of the first wiring. A plurality of first electrodes may also be disposed on the surface of the second conduction layer.

The second electrode usually has an overall electrode that covers substantially the entire surface of the second conduction layer in order for current to be uniformly diffused in-plane to the second conduction layer, and a pad electrode whose upper surface is a connecting portion in order to connect to the second wiring and formed on the overall electrode. The overall electrode is preferably an ohmic electrode that can make a good electrical connection to the second conduction layer. The overall electrode is usually formed over the entire surface of the semiconductor stacked-layer structure other than the region where the first electrode is formed, so entire surface other than a portion where the pad electrode is formed is preferably covered by an insulating protective film or the like. There are preferably a plurality of connection portions, such as a first connection portion and a second connection portion, and there may be further one or more other connection portions. These connection portions are electrically linked by the overall electrode. The width of the first connection portion and second connection portion of the second electrode preferably corresponds to the width of the second wiring. These portions may all have the same width or may have different widths.

Because the second electrode is thus connected to a plurality of second wiring by mutually linked connection portions, the segmented second wiring can be linked by the second electrode of the light emitting elements, so the wiring pattern can be made finer and matrix wiring by means of a simple pattern, that is, without using multilayer wiring of a substrate wiring. In addition, current can be pass through the segmented second wiring using the second electrode in addition to the inside of the semiconductor stacked-layer structure, so conductive resistance can be lower when applying current. This allows the heat generated during the light emitting element lighting to reduce, as a result, the reliability of the light emitting device can be enhanced.

The second electrode may have a region that is opposite the first wiring in the mounting of the light emitting elements to the drive substrate. In this case, there may be a gap so that the second electrode and the first wiring are not in contact. Alternatively, as discussed above, an insulating protective film may be formed on the surface of the first wiring in the region opposite the second electrode or on the surface of the second electrode in the region opposite the first wiring. This reliably prevents short-circuiting.

Examples of the insulating protective film include oxides, nitrides, and fluorides of silicon, aluminum, niobium, zirconium, titanium, and the like, either as a single-layer film or a multilayer film. The film thickness can be adjusted as needed.

The first electrode and second electrode can be formed, for example, from aluminum, silver, gold, platinum, palladium, rhodium, nickel, tungsten, molybdenum, chromium, titanium, or another such metal or alloy thereof, or ITO or another such oxide conductive material, either as a single-layer film or a multilayer film. The film thickness can be any one that is used in this field.

This overall electrode also functions as a reflective layer that reflects the light emitted by the light emitting layer toward the light extraction surface. Therefore, this overall electrode is preferably formed so as to have good reflectivity for the wavelength of at least the light emitted by the light emitting layer. The overall electrode is preferably, for example, a single-layer film composed of silver or a silver alloy with high optical reflectivity. The overall electrode may also be a multilayer film with a film composed of nickel and/or titanium or the like, in which the above-mentioned silver or silver alloy film is the lowermost layer.

When silver is used as the overall electrode, a cover electrode that covers the overall electrode is preferably provided. The cover electrode diffuses current over the entire surface of the second conduction layer, just as the overall electrode does. In addition, the cover electrode covers the top and side surfaces of the overall electrode, shades the overall electrode, and prevents contact between the overall electrode and the second electrode. Consequently, the cover electrode functions as a barrier layer for preventing migration of the material of the overall electrode, and particularly, silver. The cover electrode can be formed, for example, from one or more metals selected from the group consisting of titanium, gold, tungsten, aluminum, copper, and so forth, or an alloy of these. The cover electrode may be a single-layer film or a multilayer film. More specifically, the cover electrode may be a single-layer film of an Al—Cu alloy, an Al—Cu—Si alloy, or the like, or a multilayer film that includes such a film. The overall electrode and the cover electrode can each be formed by sputtering, vapor deposition, or the like.

The surfaces of the first electrode and the second electrode usually are not level since the first electrode and the second electrode are connected to different surfaces at different level within the semiconductor layer. However, it is preferable in the case where the thickness of the first electrode and second electrode is controlled, or a bump electrode, a conductive single-layer film or stacked film, or the like is disposed over the first electrode and the second electrode, so that the two surfaces will be formed substantially flush, that is, so that their surfaces are located at the same height. A configuration such as this affords reliable mounting to the drive substrate of the light emitting device, without short-circuiting.

The light emitting elements usually may be mounted face-up, in which the insulated substrate side of the light emitting elements is bonded to the drive substrate, but flip-chip mounting is preferable. In this mounting, it is preferable to use a bonding member selected from among a solder based on tin-bismuth, tin-copper, tin-silver, gold-tin, or the like, a conductive paste of silver, gold, palladium, or the like, a bump (printed bump, stud bump, plated bump and the like), an anisotropic conductor, a low-melting point metal, or another such braze, or the like, for example.

When the light emitting elements are flip-chip mounted, the first electrode and/or the second electrode is preferably connected to the first wiring and/or second wiring via a stud bump or a solder ball. It is particularly favorable for the second electrode to be connected to the second wiring via a stud bump. Since the second electrode functions as a metal member that bridges the segmented second wiring, it is necessary for it not to be electrically connected to the first wiring, but to be connected to the second wiring at two or more points. Accordingly, it is preferable for it to be connected by a member that can maintain a constant height, without spreading out, so as not to come into contact with the first wiring that is disposed so as to segment the second electrode. The stud bump referred to here means that there is a wire (stud) of a specific length (height) on a compression ball that has been press-fitted to an electrode. Usually, a stud bump can be formed with a wire bonding apparatus or a bump bonding apparatus. The light emitting elements that are thus connected preferably have the above-mentioned bonding member interposed in order to strengthen the bonding between electrode and wiring.

A solder ball preferably has a core and a cover component on the outside of the core, whose melting point is lower than the melting point of the core. The core should be able to maintain its shape during reflow mounting with a solder ball. More specifically, it is preferable if the main component of the core is copper, and the cover component is made of an alloy that contains gold and one or more of silicon, germanium, and tin. It is also favorable for there to be a specific under-layer that surrounds the core, and a tin-based cover film over this. Nickel, Ni—B, Ni—P, or the like can be used as the under-layer. The tin-based cover film here may be a single-layer cover film of a tin alloy, or may be a multilayer film of tin and other alloy components or a tin alloy. In the case of a multilayer film of tin and other alloy components or a tin alloy, the tin and other alloy components or tin alloy are melted in the reflow step for forming a bump of a copper core ball over the wiring of the drive substrate, which forms a uniform alloy layer.

The core preferably has copper as its main component (that is, has a copper content of at least 50 wt %). It is particularly favorable to use a ball of an alloy of copper and one or more of zinc, tin, phosphorus, nickel, gold, molybdenum, and tungsten, or a ball with a copper content of at least 99 wt %, because the thermal conductive and electrical conductivity will be superior.

For preventing to spread out the bonding member, as described above, part of the surface of the first wiring or the second wiring is preferably remover by laser trimming, and an exposed surface of the first wiring or the second wiring thus obtained is preferably converted to the oxide. This allows the bonding member to ensure the stability of the position and shape even when the bump or the like is used to bond the wiring and the electrode.

With the light emitting device disclosed herein, the light emitting elements are mounted over the first wiring of the above-mentioned drive substrate, and over at least two of the second wiring (two or more when the second wiring is segmented) disposed apart from each other and on either side of the first wiring. The first electrode of the light emitting elements is connected on the first wiring, and the second electrode is connected on the second wiring. Two or more of the light emitting elements are preferably disposed in the second direction, and even more preferably two or more are disposed in each of the first direction and the second direction. Consequently, the first wiring and the second wiring are electrically connected in a matrix, for example, in the first direction and the second direction, or in a row in the second direction, by the light emitting elements at locations corresponding to the sites where they intersect. This allows the drive of the light emitting elements to be controlled independently. Thus, just the desired number and the light emitting elements at the desired locations can be switched on or off as desired. Also, the amount of current can be controlled for just the light emitting elements desired, and contrast can be provided within the light emitting device. In particular, as discussed above, when the second electrode of the light emitting elements is connected to two or more of the segmented second wiring, current can be pass through the segmented second wiring using the second electrode in addition to the inside of the semiconductor stacked-layer structure so conductive resistance can be lower during current applied.

And since a light emitting device can be obtained with which the turning on and off of light emitting elements can be controlled as desired, it can be used effectively in an adaptive driving beam headlamp system as what is known as an adaptive driving beam headlamp, as will be discussed below.

Reflective Member

The light emitting elements mounted on the drive substrate preferably each have a reflective member formed around the light emitting element. The reflective members are preferably disposed in contact with the side surfaces of the light emitting elements. The reflective members are preferably disposed surrounding the connection components of the first electrode and first wiring, and of the second electrode and second wiring, between the substrate and the light emitting elements. The reflective members may be disposed for each light emitting element, or for a group of light emitting elements, but are preferably formed integrally with respect to all of the light emitting elements. This allows all of the light emitted from the light emitting elements to be efficiently extracted from the light extraction surface side (the upper or lower surfaces of the light emitting elements). Also, this affords a clear brightness boundary between the emission region and the non-emission region, giving an emission state that has better visibility.

The reflective material that makes up the reflective member is preferably one capable of efficiently reflecting the light emitted from the light emitting elements, etc., and more preferably a material capable of reflecting at least 80%, and still more preferably at least 90%, of the peak wavelength of this light. An insulating material is preferable.

There are no particular restrictions on the reflective material, but a material capable of reflecting light is preferable, such as particles of $SiO_2$, $TiO_2$, $ZrO_2$, $BaSO_4$, MgO, ZnO, and the like. These materials may be used singly, or a combination of two or more types may be used. These materials are usually used as a mixture with a thermosetting resin, a thermoplastic resin, or the like, specific examples of which include epoxy resin compositions, silicone resin compositions, silicone-modified epoxy resins, and other such modified epoxy resin compositions; epoxy-modified silicone resins and other such modified silicone resin compositions; hybrid silicone resins; polyimide resin compositions and modified polyimide resin compositions; polyphthalamide (PPA); polycarbonate resin; polyphenylene sulfide (PPS); liquid crystal polymer (LCP); ABS resin; phenol resin; acrylic resins; PBT resins, and other such resins.

The reflective member preferably has a thickness of about 1 to 100 μm, for example. It is particularly preferable when the upper surface of the reflective member does not cover the upper surfaces of the light emitting elements, and is formed so as to be disposed either substantially level with the upper surfaces of the light emitting elements, or above the upper surfaces of the light emitting elements. This prevents the light of the light emitting elements from leaking out in the lateral direction. Also, relatively strong light emitted from the side surfaces of the semiconductor layer including the light emitting layer can be blocked by the reflective member, and color unevenness can be reduced. Also, the above-mentioned reflective material is preferably contained in an amount of at least 40 wt % with respect to the total weight of the reflective member in order to improve reflectivity.

Wavelength Conversion Layer

A wavelength conversion layer converts the light from the light emitting elements to a different wavelength, and is preferably disposed in the light emitting device on the light extraction surface side of the light emitting elements. A phosphor or quantum dots can be used, for example, as the wavelength conversion layer.

Examples of the phosphor constituting a phosphor layer as one of the wavelength conversion layer include nitride-based phosphors or oxynitride-based phosphors activated mainly with lanthanoid elements such as europium or cerium, and sialon-based phosphors. More specifically, (A) α or β-sialon phosphors or various alkaline earth metal nitride silicate phosphors, which are activated with europium, (B) alkaline earth metal halogen apatite phosphors, alkaline earth halo-silicate phosphors, alkaline earth metal silicate phosphors, alkaline earth metal borate halogen phosphors, an alkaline earth metal aluminate phosphors, alkaline earth metal silicates phosphors, alkaline earth metal sulfides phosphors, alkaline earth metal thiogallate phosphors, alkaline earth metal nitride silicate phosphors, germanate salt phosphors, which are activated with lanthanoid such as europium or transition metal such as manganese, (C) rare earth aluminates phosphors, rare earth silicates phosphors, which are activated with lanthanoid elements such as cerium, or (D) organic substance and organic complexes which are activated with lanthanoid element such as europium.

Examples of the quantum dot include a nano-size high-dispersive particles of semiconductor materials, for example group II-VI, group III-V and group IV-VI semiconductors, more specifically CdSe, core-shell type $CdS_xSe_{1-x}$/ZnS, GaP, InP, and GaAs. Further, InP, InAs, InAsP, InGaP, ZnTe, ZnSeTe, ZnSnP and $ZnSnP_2$ are included in the examples.

The phosphor layer is usually disposed on the upper surfaces of the light emitting elements, around the time when the light emitting elements are mounted on the drive substrate, in substantially the same size and shape as those of the light emitting elements, or slightly larger.

The phosphor layer can be formed by adhesive bonding, electrodeposition, electrostatic coating, sputtering, vapor deposition, potting, printing, spraying, or another such method. Adhesive bonding allows the phosphor layer to be formed simply, by affixing a sheet or plate that uniformly includes the phosphor layer. Electrodeposition, electrostatic coating, sputtering, and vapor deposition allow the phosphor layer to be affixed without the use of a binder, over the entire substrate and light emitting elements. After the phosphor layer has been affixed, it may be impregnated with a resin or the like that will serve as a binder. The phosphor can be selectively affixed by using a phosphor dispersed in a light-transmissive member in potting, printing, or spraying. The light-transmissive member here can be formed from a material capable of transmitting at least 60%, and preferably at least 70%, and more preferably at least 80%, of the peak wavelength of the light emitting elements, and can be selected as needed from among the above-mentioned thermoplastic resins, thermosetting resins, and so forth.

The thickness of the phosphor layer can be suitably adjusted according to its manufacturing method, such as the phosphor particle deposition conditions and duration. For instance, about 0.01 to 100 μm is preferable. The phosphor layer is preferably formed in a substantially uniform thickness.

When the reflective member is formed as discussed above, it preferably also covers the side surfaces of the phosphor layer, just as it does the side surfaces of the light emitting elements. This allows the light of lit light emitting elements to be reliably extracted from the light extraction surfaces, regardless of whether adjacent light emitting elements are turning on and off. Preferably the entire side surfaces of the phosphor layer are covered by the reflective member, both in the thickness direction and around the outside. This allows the above-mentioned effects to be obtained more efficiently.

Connectors or other such electronic parts or the like may be further mounted corresponding to the layout of the above-mentioned routing wirings and so forth. A protective element may also be mounted.

Adaptive Driving Beam Headlamp System

With an adaptive driving beam headlamp system, while a vehicle is being driven with its headlamps on high beam, in the case where there is a vehicle ahead (such as a vehicle in an oncoming lane or a vehicle ahead in the same lane) or a pedestrian appears in front of the vehicle, an onboard camera detects the position of the car or pedestrian ahead, dims the light at only that location, and keeps the high beams shining on the other locations. The shaded area is automatically adjusted out of the area illuminated by the headlights, so as to match the position of the vehicle or person ahead, which keeps the driver of the vehicle ahead or the pedestrian from being blinded by the light. On the other hand, the driver of the vehicle will always have a field of vision that is close to that of driving with the high beams on, so the driver can easily see pedestrians, road signage, the shape of the road in the distance, and so forth, and this results in safer operation.

This system has the above-mentioned light emitting device, an onboard camera that recognizes the position of a vehicle or person ahead, etc., and an electronic control unit that determines the area to be shaded and the light distribution pattern. With this configuration, the light emitting device takes on the role of an adaptive driving beam headlamp with which control to either shade or illuminate a certain position is achieved by turning on and off the individual light emitting elements under the relational action of the onboard camera, the electronic control unit, etc.

Therefore, a drive unit (ACT) for lens movement or lamp swivel or the like, which was required with a conventional automotive forward illumination apparatus, is not needed, and the same control is possible with just the turning on and off of the light emitting elements.

The light emitting device usually functions as a pair of automotive adaptive driving beam headlamps disposed on the left and right sides of the vehicle. As discussed above, each light emitting device is equipped with a plurality of light emitting elements. In addition to these light emitting elements, the light emitting device may also has a projecting lens, a reflecting mirror, lamp bodies to house these, and so on.

The onboard camera captures images of what is ahead of the vehicle and transmits the results to the electronic control unit.

The electronic control unit is usually constituted by a microprocessor that includes a CPU, a RAM, a ROM, and/or an I/O, etc. Programs for performing light distribution control and so forth are stored in the ROM. The RAM is used as a work area when the CPU performs various kinds of computation, etc.

The electronic control unit is connected to the onboard camera, detects vehicles ahead (oncoming vehicles, vehicles ahead in the same lane, pedestrians) as well as other objects on the road, pavement markings, and the like, and calculates the data needed for light distribution control, such as the attributes, positions, and so forth of these things. The electronic control unit determines the light distribution pattern that suits the driving situation on the basis of the calculated data.

The electronic control unit then determines the amount of control of the light emitting device required to achieve this light distribution pattern. The amount of control here is, for instance, the position, range, etc., of the shaded region, and control details for the various light emitting elements in the light emitting device (whether they are on or off, whether the power is on, etc.) are det ermined on the basis of this control amount.

The electronic control unit is usually connected to the light emitting devices via a driver. Thus, the determined control details are sent by the driver to the light emitting devices, and the specific on/off switching of the light emitting elements in the light emitting device is controlled.

Embodiments of the drive substrate, light emitting device, and adaptive driving beam headlamp system disclosed herein will now be described in specific terms through reference to the drawings.

Embodiment 1

Drive Substrate

As shown in FIG. 1A, a drive substrate 10 used by a light emitting device 90 in this embodiment has a substrate 13, first wiring 11 (examples of first wiring members), and second wiring 12 (examples of second wiring members).

The substrate 13 is constituted by a single-layer structure made of aluminum nitride. Its size is 10×10 mm and its thickness is 0.5 mm, for example.

The first wiring 11 and the second wiring 12 are formed by a TiW/Cu/Ni/Au stacked-layer structure (starting from the substrate 13 side) on a first main surface 13a of the substrate 13. The TiW and copper films are each formed in a thickness of 0.1 μm by sputtering through a mask on the substrate 13, and the nickel and gold films are formed on the surface thereof by plating in a thickness of 1.27 μm and 1.5 μm, respectively.

When the first main surface 13a of the substrate 13 will be the xy plane, for example, there are four first wiring 11 disposed extending in the x axis direction (as the first direction), as shown by the arrow. For example, the width Q of the first wiring 11 is 100 μm, and the length is 3 mm. The spacing between adjacent first wiring 11 is 500 μm.

The second wiring 12 are disposed in a number corresponding to four, to pair up with the four first wiring 11, along the y axis direction (as the second direction), as shown by the arrow. The second wiring 12 disposed along the y axis direction are disposed separated from one another. Also, a single second wiring 12 branches in two at the other end side. Thus, two second wiring 12 are disposed adjacent on the distal end side of the first wiring 11 and between the first wiring 11. The width M of the second wiring 12 is 540 μm, the width N1 and N2 of one branch of the second wiring 12 is 220 μm, the spacing between branched, adjacent second wiring 12 is 100 μm, and the length thereof is 480 μm.

Thus, the second wiring 12 are segmented by the first wiring 11, and in the state of the drive substrate 10, the second wiring 12 are not electrically connected to each other. However, the segmented second wiring 12 are linked by mounting light emitting elements (discussed below), and consequently a plurality of electrically connected second wiring 12 (four here) are disposed so as to be paired with the first wiring 11. The result is a drive substrate that allows the drive of a plurality of light emitting elements to be controlled independently from one another.

The first wiring 11 and the second wiring 12 are respectively connected to routing wiring 11a and 12a at the other end side (different form the distal end), and the routing wiring 11a and 12a extend to connector-use pad electrodes 11b and 12b disposed at the end of the drive substrate 10.

The drive substrate 10 thus configured allows matrix wiring to be formed in a single-layer structure on the single-layer substrate 13, so a plurality of light emitting elements can be mounted at high density by varying the width, length, spacing, and so forth of the wiring as needed. In particular, since there is no need to form the matrix wiring from a multilayer structure, the thickness or size thereof can be kept small. Also, using a single-layer structure means that even though the light emitting elements are disposed at high density, heat attributable to the emission of the light emitting elements will not be trapped inside the substrate, and can be quickly released from the front and rear surfaces, so heat dissipation can be made even better.

Because the steps involved in manufacturing this drive substrate are extremely simple, increases to the manufacturing cost can be kept low. Furthermore, expansion and contraction of the substrate and so forth can be avoided, so that a more accurate drive substrate is obtained.

Light Emitting Device

Figure 1B:
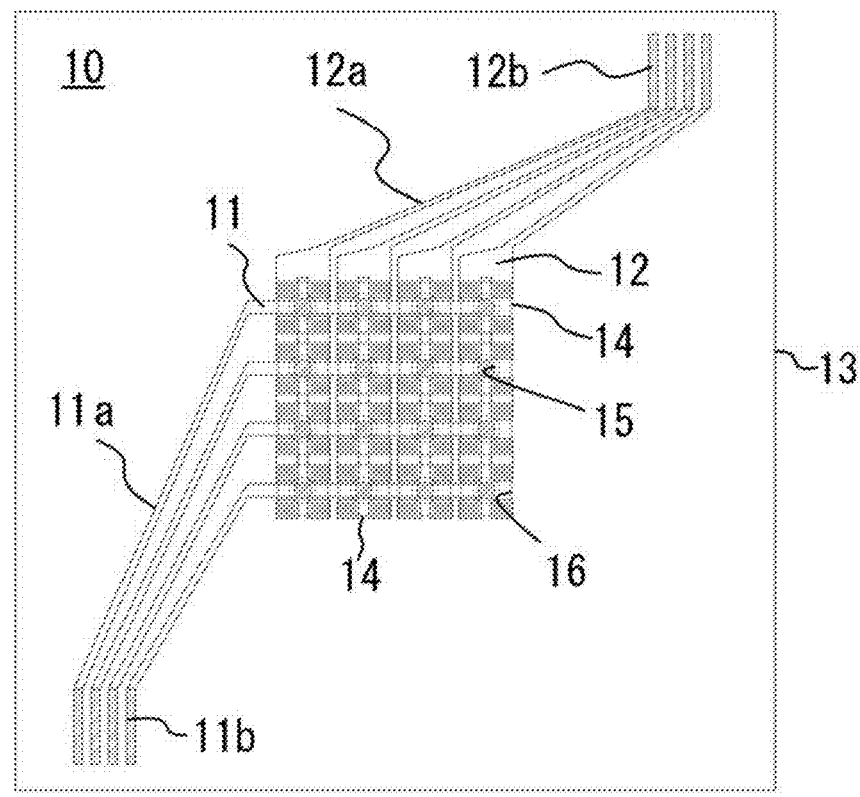
FIG. 1B is a simplified plan view of the drive substrate in FIG. 1A in which light emitting elements have been mounted.
Figure 2A:
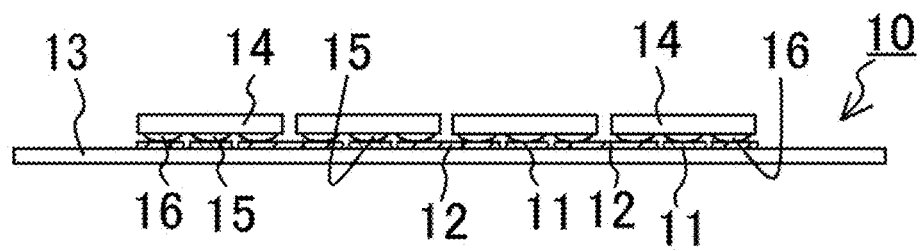
FIG. 2A is a simplified cross section (cut along the A-A' line in FIG. 1A) of the manufacturing steps for the light emitting device disclosed herein.
Figure 2B:
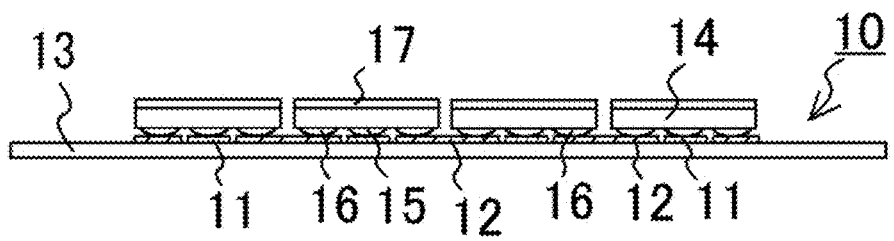
FIG. 2B is a simplified cross section of the manufacturing steps for the light emitting device according to an embodiment of the present invention.
Figure 2C:
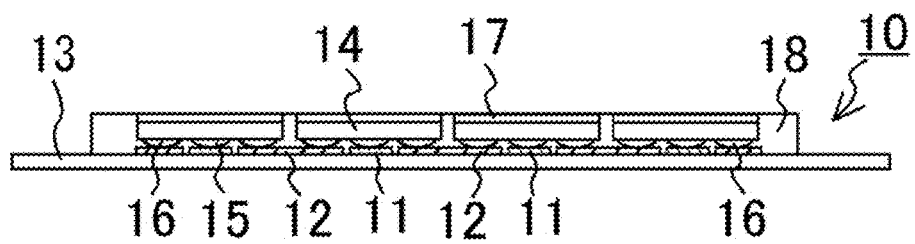
FIG. 2C is a simplified cross section of the manufacturing steps for the light emitting device according to an embodiment of the present invention.
Figure 2D:
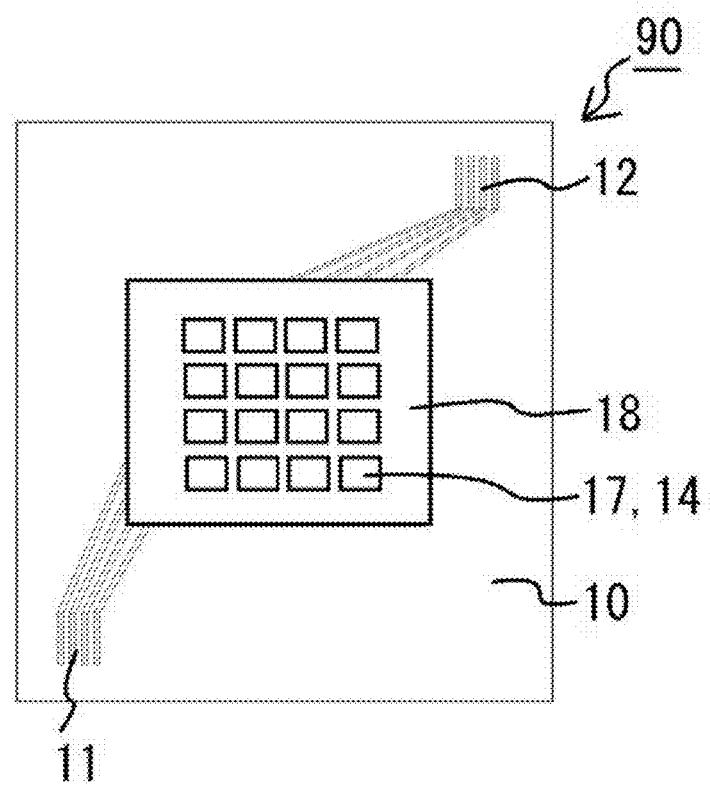
FIG. 2D is a simplified plan view of the light emitting device of FIG. 2C.

As shown in FIGS. 2C and 2D, the light emitting device 90 in this embodiment is configured such that sixteen light emitting elements 14 are mounted as shown in FIG. 1B on the above-mentioned drive substrate 10.

Figure 1C:
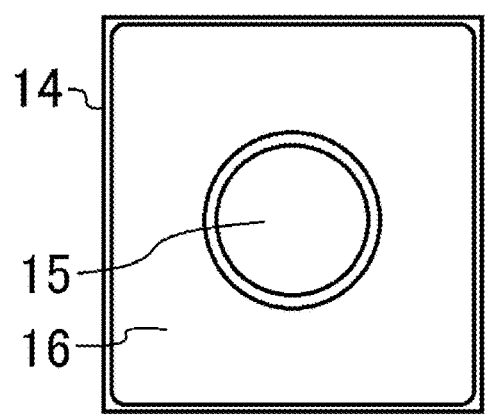
FIG. 1C is a simplified plan view of a light emitting element, showing the layout of the electrodes of the light emitting elements installed on the drive substrate in FIG. 1A.
Figure 1D:
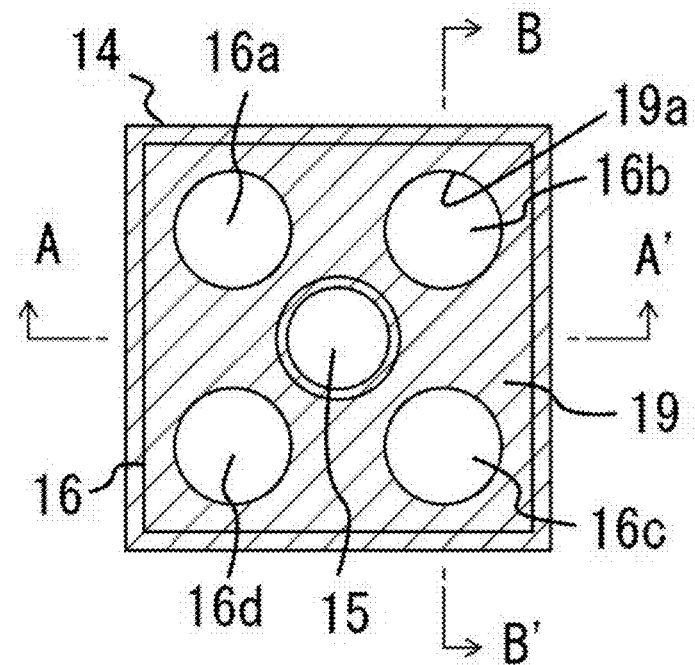
FIG. 1D is a simplified plan view of a light emitting element, showing another layout of the electrodes of the light emitting elements installed on the drive substrate in FIG. 1A.
Figure 1E:
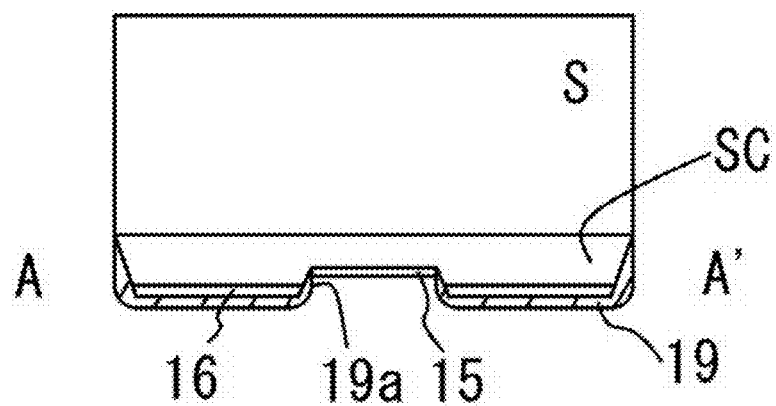
FIG. 1E is a cross section along the A-A' line in FIG. 1D.
Figure 1F:
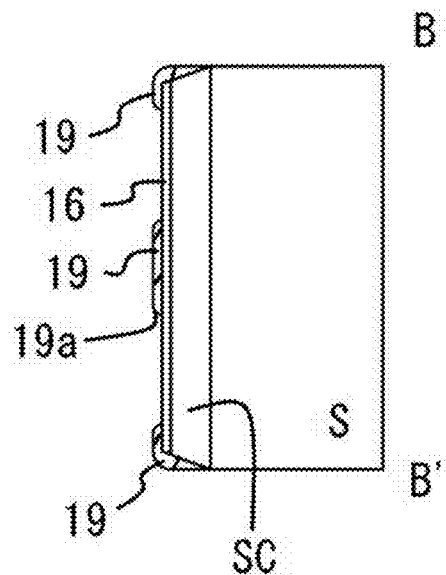
FIG. 1F is a cross section along the B-B' line in FIG. 1D.

As shown in FIGS. 1D, 1E, and 1F, for example, each light emitting element 14 has a semiconductor stacked-layer structure SC that includes a first conduction layer, a light emitting layer, and a second conduction layer on a sapphire substrate S, and a first electrode 15 and second electrodes 16 are formed on the same face side of this semiconductor stacked-layer structure SC.

As shown in FIG. 1C, the first electrode 15 and the second electrodes 16 are disposed on the inside of the light emitting element 14 in plan view. The first electrode 15 has a circular shape with a diameter of about one-fourth to one-third one side of the light emitting element 14, for example, and is disposed in the center of the light emitting element 14. The second electrodes 16 are disposed so as to surround the first electrode 15, in an outer shape that is about the same as or slightly smaller than the light emitting element 14.

The first electrode 15 and the second electrodes 16 have different surface positions on the connected semiconductor layer, so the surface of the semiconductor layer on which these electrodes are formed is stepped at the outset. However, the surfaces of the first electrode 15 and the second electrodes 16 can be formed substantially flush, that is, formed so that they are located at the same height, by controlling the thickness of the conductive single-layer film or stacked film, such as an external connection-use electrode connected to the, first electrode and the second electrodes, or the thickness of the first electrode and the second electrodes.

When such light emitting elements 14 are mounted on the drive substrate 10, the light emitting elements 14 are flip-chip mounted. The first electrode 15 in this embodiment is connected to the first wiring 11 via a stud bump whose material is gold, and the second electrodes 16 are connected to the second wiring 12 via stud bumps whose material is gold.

In the case where the second electrodes 16 and the second wiring 12 are connected by AuSn or other such solder material as a bonding member, for example, instead of using stud bumps, the solder material will spread out along the shape of the second electrodes 16. As shown in FIGS. 1B and 1C, part of the first wiring 11 is opposite the second electrodes 16 of the light emitting elements 14. Accordingly, when the bonding member such as this is used, short-circuiting between the first wiring 11 and the second electrodes can be prevented by forming a protective film composed of $SiO_2$, for example, in the region opposite the second electrodes 16 of the first wiring 11. When a member other than solder is used as the bonding member, i.e., the bump is used as described above, the protective film is also preferably formed in the region opposite the second electrodes 16 of the first wiring 11.

More specifically, as shown in FIGS. 1D to 1F, a protective film 19 is preferably formed on the surface of the second electrodes 16 so as to expose at least two connection parts or connection components 16a and 16b (for example, four connection components 16a, 16b, 16c, and 16d), and also to expose the first electrode 15.

The light emitting element 14 is fixed by a bonding member such that the first electrode 15 disposed in the center is disposed in the center in the x axis direction of two of the second wiring 12 disposed apart from each other on either side of the first wiring 11 (when branched, then two on each side). Also, it is fixed by a bonding member such that both sides of the second electrodes 16 disposed surrounding the first electrode 15 are each disposed on two of the second wiring 12. Consequently, the second wiring 12 are electrically connected in the y direction by the light emitting element 14 at mutually isolated sites, without intersecting.

Accordingly, the drive of each of the light emitting elements can be independently controlled. As a result, just the light emitting elements at the desired positions can be switched on or off in the desired number. Also, the amount of current can be controlled for just the light emitting elements desired, and contrast can be provided within the light emitting device.

In addition, by the second electrodes 16 are connected to the second wiring 12 that are segmented by the plurality of connection components 16a to 16d, current can be pass through the segmented second wiring using the second electrode, so conductive resistance can be lower when applying current.

A phosphor layer is provided as a wavelength conversion layer 17 to each of the light emitting elements 14, on the surface opposite the drive substrate 10. The wavelength conversion layers 17 have substantially the same size and shape as the light emitting elements 14. The wavelength conversion layers 17 are formed from glass containing YAG, are uniform in thickness over the entire surface, and are 100 µm thick.

A reflective member 18 is integrally formed on the drive substrate 10 on which the sixteen light emitting elements 14 are mounted such that the reflective member 18 is in contact with the entire side surfaces of the light emitting elements 14, and is disposed between the light emitting elements 14 and the drive substrate 10.

The reflective member 18 is formed from a silicone resin containing 30 wt % $TiO_2$. The size of the reflective member 18 is 2.5×2.5 mm, and its thickness is about 0.25 mm.

The reflective member 18 also covers, all of the side surfaces of the wavelength conversion layers 17, and its upper surface coincides with the upper surfaces of the wavelength conversion layers. Consequently, the light of lit light emitting elements can be reliably extracted from the light extraction surface, regardless of the turning on and off of adjacent light emitting elements.

Figure 1G:
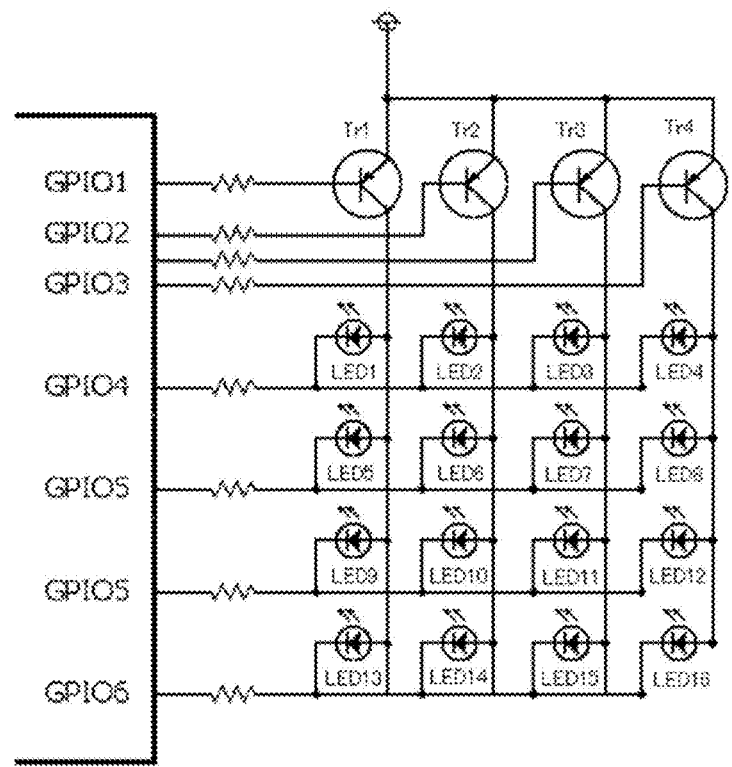
FIG. 1G is a diagram of a matrix circuit involving a drive substrate in which light emitting elements have been installed.

As shown in FIG. 1G, the light emitting device 90 configured as above has a circuit in which a matrix circuit is completed by the mounting of the light emitting elements, so the turning on and off of the desired light emitting elements can be freely controlled in the desired number.

The above-mentioned light emitting device can be manufactured as follows.

First, as shown in FIG. 2A, the drive substrate 10 and the light emitting elements 14 are prepared. The light emitting elements 14 are mounted via stud bumps in a 4×4 matrix. The spacing between the light emitting elements 14 is 100 µm, for example.

Then, as shown in FIG. 2B, the wavelength conversion layers 17 are placed over the light emitting elements 14. The wavelength conversion layers 17 can be fixed to the light emitting elements 14 with a light-transmissive adhesive agent, for example.

After this, as shown in FIG. 2C, the 16 light emitting elements 14 are integrally covered by the reflective member 18. The reflective member 18 is formed by molding in upper and lower molds, for example. The entire side surfaces of the light emitting elements 14 and between the light emitting elements 14 and the substrate 13 are covered by the reflective member 18, and the upper surface of the reflective member 18 is flush with the upper surface of the wavelength conversion layers.

Modification Example 1

Drive Substrate

As shown in FIG. 3A, the drive substrate 20 in this modification example has the substrate 13, first wiring 21, and second wiring 22. The first wiring 21 and the second wiring 22 are disposed extending in the x axis direction and the y axis direction, respectively, so that the light emitting elements are disposed in a 3×3 matrix.

The first wiring 21 is disposed extending in three parallel rows in the x axis direction, as indicated by the first wiring 21x, 21y, and 21z.

The second wiring 22 is disposed in a number corresponding to three rows so as to pair up with the three rows of first wiring 21 along they axis direction, as indicated by the second wiring 22x, 22y, and 22z. However, the second wiring 22x, 22y, and 22z disposed along the y axis direction are disposed with two between the first wirings 21, one at the distal end of the first wiring 21, and one at the other end, with the four of them separated from one another.

The width M of the second wiring 22 is 540 µm, and the length is 480 µm. The width Q of the first wiring 21 is 100 µm.

Otherwise, the configuration is substantially the same as that of the drive substrate in Embodiment 1.

Figure 3B:
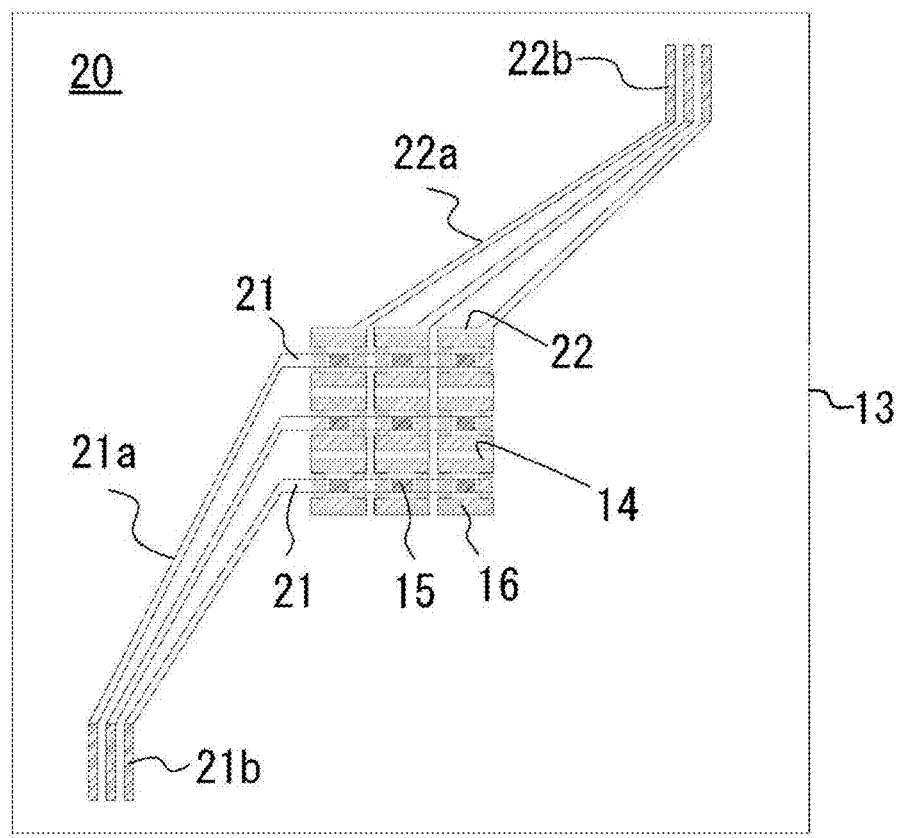
FIG. 3B is a simplified plan view of the drive substrate in FIG. 3A in which light emitting elements have been installed.

As shown in FIG. 3B, the light emitting elements 14 are fixed by bonding members on the drive substrate 20 so that the first electrode disposed in the center is disposed in the center in the x axis direction of the two second wiring 22 disposed apart from each other on either side of the first wiring 21. Also, they are fixed by bonding members so that both sides of the second electrodes disposed surrounding the first electrode are each disposed on two of the second wiring 22.

Consequently, the first wiring 21 and the second wiring 22 are electrically connected to each other in a low-resistance state in the x direction and the y direction by the light emitting elements 14 at sites where they intersect, but are separated from one another. Thus, the effect is substantially the same as that of the drive substrate in Embodiment 1.

Embodiment 2

Drive Substrate

As shown in FIG. 4A, the drive substrate 30 in this embodiment has the substrate 13, first wiring 31, and second wiring 32. The first wiring 31 and the second wiring 32 are disposed in the x axis direction and the y axis direction, respectively, so that the light emitting elements are disposed in a 3×3 matrix.

The first wiring 31 is disposed extending in three rows in the x axis direction. However, one row of the first wiring 31 is branched into three.

The second wiring 32 is disposed in a number corresponding to three rows so as to pair up with the three rows of first wiring 31 along the y axis direction, as indicated by the second wiring 32x, 32y, and 32z. However, the second wiring 32x, 32y, and 32z disposed along the y axis direction are disposed with two between the first wirings 31, one at the distal end of the first wiring 31, and one at the other end, with the four of them separated from one another.

Otherwise, the configuration is substantially the same as that of the drive substrate in Embodiment 1.

Light Emitting Elements

Figure 4B:
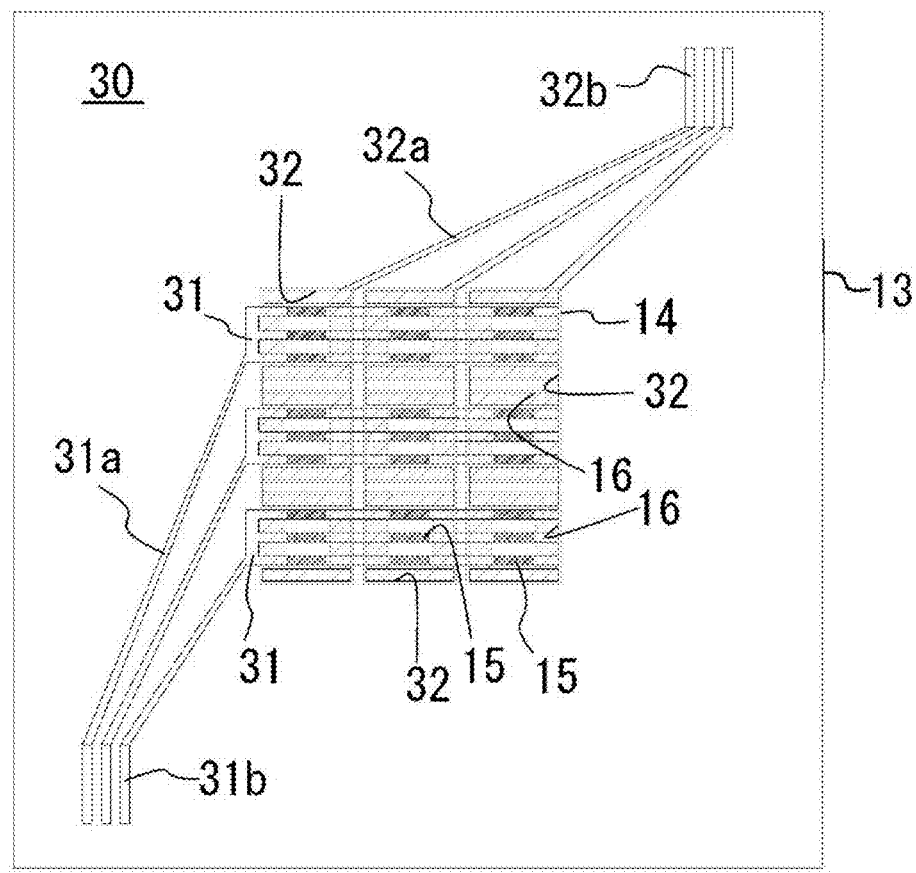
FIG. 4B is a simplified plan view of the drive substrate in FIG. 4A in which light emitting elements have been installed.
Figure 4C:
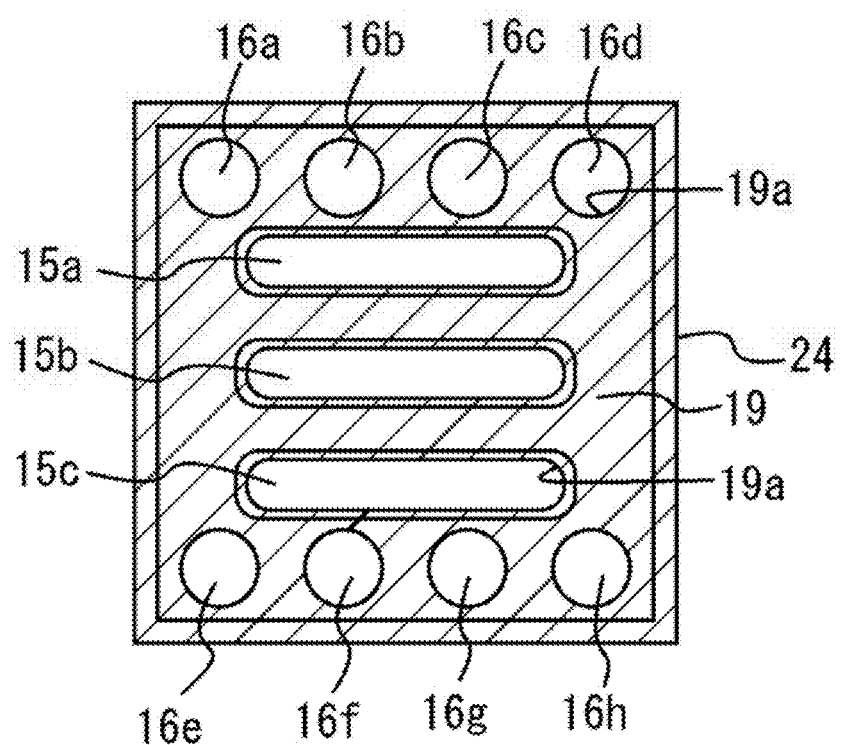
FIG. 4C is a simplified plan view of a light emitting element, showing the layout of the electrodes of the light emitting elements installed on the drive substrate in FIG. 4A.

With the light emitting device in this embodiment, as shown in FIG. 4C, the light emitting elements 24 are such that a semiconductor stacked-layer structure SC including a first conduction layer, a light emitting layer, and a second conduction layer is stacked over a sapphire substrate S, and first electrodes 15 and second electrodes 16 are formed on the same face side as this semiconductor stacked-layer structure SC.

Three of the first electrodes 15 are disposed parallel to each other on the inside of the light emitting elements 24 in plan view, so as to correspond to the pattern of the first wiring of the drive substrate discussed above. The width of the first electrodes 15 is about 70 µm, and the length is about 420 µm. Four of the second electrodes 16 are disposed above and below, and parallel to, the first electrodes 15, as the connection components 16a to 16g.

Otherwise, the configuration is substantially the same as that of the light emitting device in Embodiment 1.

As shown in FIG. 4B, the light emitting element 14 is fixed by a bonding member on this drive substrate 30 so that the first electrodes disposed in the center will be disposed in the center in the x axis direction of two of the second wiring 32 disposed apart from each other on either side of the first electrode 31. It is also fixed by a bonding member so that both sides of the second electrodes disposed surrounding the first electrodes are each disposed on two of the second wiring 32.

Consequently, the first wiring 31 and the second wiring 32 are electrically connected to each other in a low-resistance state in the x axis direction and the y axis direction by the light emitting elements 14 at sites where the wiring does not intersect, and is separated from one another. Thus, the effect is substantially the same as that of the drive substrate in Embodiment 1.

Modification Example 2

Drive Substrate

As shown in FIG. 5A, the drive substrate 40 in this modification example has the substrate 13, first wiring 41, and second wiring 42. The first wiring 41 and the second wiring 42 are disposed in the x axis direction (stepped) and the y axis direction, respectively, so as to dispose the light emitting elements in a 3×3 matrix.

The first wiring 41 is disposed extending in three stepped rows in the x axis direction. The second wiring 42 is disposed in the y axis direction in a number corresponding to three rows so as to pair up with the three rows of the first wiring 41, as indicated by the second wiring 42x, 42y, and 42z. However, two rows of the second wiring 42 disposed in the y axis direction are disposed between the first wiring 41, one is disposed at the distal end of the first wiring 41, and one at the other end, with the four of them separated from one another. Three of the rows of the second wiring 42 are offset in they axis direction according to the steps of the first wiring 41. Otherwise, the configuration is substantially the same as that of the drive substrate in Embodiment 1.

Figure 5B:
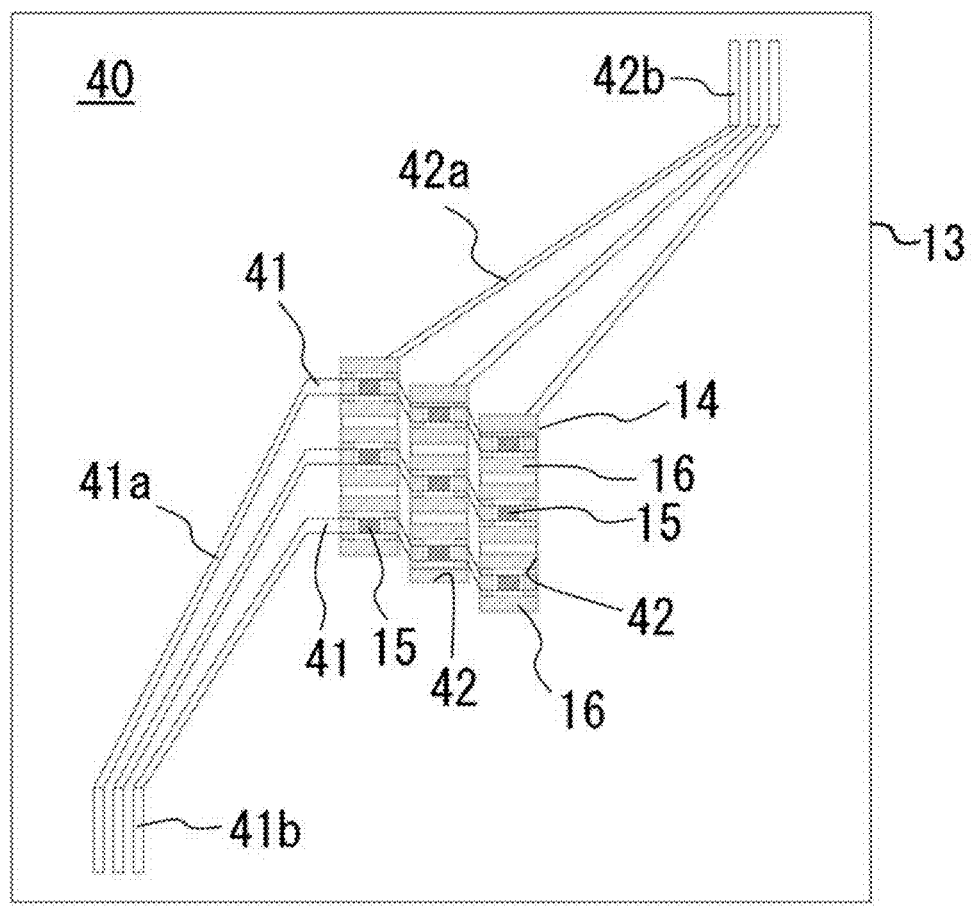
FIG. 5B is a simplified plan view of the drive substrate in FIG. 5A in which light emitting elements have been installed.

As shown in FIG. 5B, the light emitting elements 14 are fixed by bonding members on the drive substrate 40 so that the first electrode disposed in the center is disposed in the center in the x axis direction of the two second wiring 42 disposed apart, from each other on either side of the first wiring 41. Also, they are fixed by bonding members so that both sides of the second electrodes disposed surrounding the first electrodes are each disposed on two of the second wiring 22.

Consequently, the first wiring 41 and the second wiring 42 are electrically connected to each other in a low-resistance state in the x direction and the y direction by the light emitting elements 14 at sites where they are separated from one another, without intersecting. Thus, the effect is substantially the same as that of the drive substrate in Embodiment 1.

Adaptive Driving Beam Headlamp System

Figure 6A:
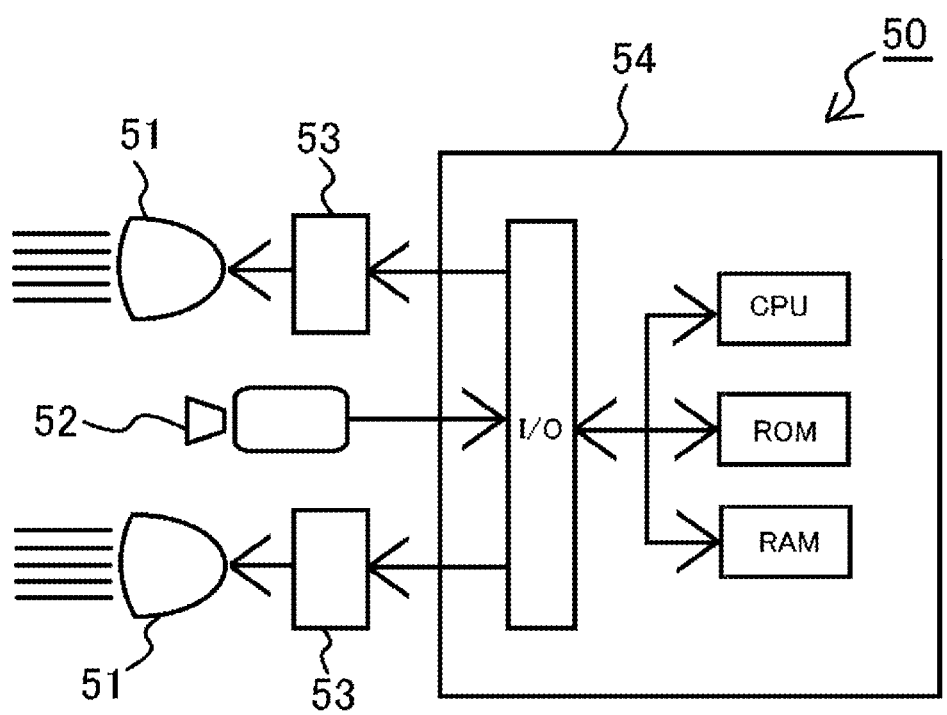
FIG. 6A is a block diagram of the electrical configuration of the adaptive driving beam headlamp system according to an embodiment of the present invention.

As shown in FIG. 6A, the adaptive driving beam headlamp system 50 in this embodiment has the light emitting device of Embodiment 2 as adaptive driving beam headlamps 51, and further has an onboard camera 52 that recognizes the position of a vehicle ahead, and an electronic control unit 54 that determines the light distribution pattern and the area to be shaded.

The light emitting devices function as a pair of automotive adaptive driving beam headlamps 51 that are disposed on the left and right of a vehicle. The light emitting devices are equipped with light emitting elements, as well as a projecting lens and a lamp body to house these.

The onboard camera 52 captures images of what is ahead of the vehicle and transmits the results to the electronic control unit 54 via a driver 53.

The electronic control unit 54 is usually constituted by a microprocessor that includes a CPU, a RAM, a ROM, and/or an I/O, etc. Programs for performing light distribution control and so forth are stored in the ROM. The RAM is used as a work area when the CPU performs various kinds of computation, etc.

Control Flow

Figure 6B:
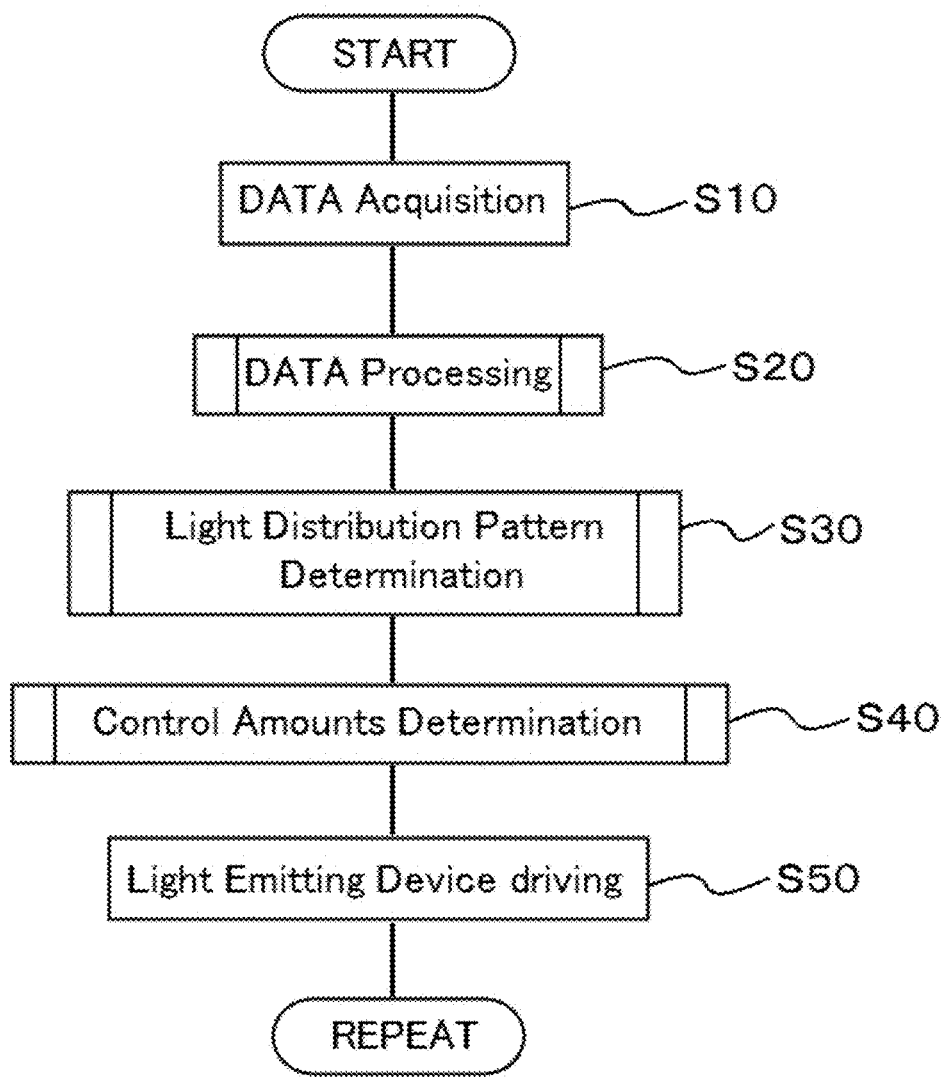
FIG. 6B is a flowchart of the control flow in the adaptive driving beam headlamp system according to an embodiment of the present invention.

The adaptive driving beam headlamp system 50 thus configured can perform control as shown in FIG. 6B.

First, the onboard camera 52 acquires the necessary data from in front of the vehicle (S10). This data is an image of ahead of the vehicle, the vehicle speed, the distance between vehicles, the shape of the road, the light distribution pattern, and so forth, for example. The acquired data is sent to the electronic control unit 54.

The electronic control unit 54 performs data processing on the basis of the acquired data (S20). This data processing results in the computation of attributes of an object ahead of the vehicle (a signal light, street lamps, etc.), attributes of vehicles and so forth (oncoming vehicle, vehicle ahead, pedestrian), vehicle speed, the distance between vehicles, the brightness of an object, the road shape (lane width, straight road), and so forth.

Next, the electronic control unit 54 determines the proper light distribution pattern on the basis of the computed data (S30). The selected control light distribution pattern is, for example, a high-beam light distribution pattern, a focused light distribution pattern for when the vehicle speed is high, a diffused light distribution pattern for when the vehicle speed is low, a low-beam light distribution pattern for when an oncoming vehicle is detected, etc.

The electronic control unit 54 determines control amounts for whether to switch on or off the various light emitting elements in the adaptive driving beam headlamp 51, and whether the power is on (S40).

The electronic control unit 54 converts the determined control amounts into driver data, and controls the drive of the adaptive driving beam headlamp 51 through the driver 53 (S50). That is, the desired number of light emitting elements, in the desired locations in the adaptive driving beam headlamp 51, are individually switched on or off to realize the desired light distribution pattern.

This series of flow steps is repeated at specific time intervals.

With the adaptive driving beam headlamp system in this embodiment, while a vehicle is being driven with its headlamps on high beam, if there is a vehicle ahead (such as a vehicle in an oncoming lane or a vehicle ahead in the same lane) or if a pedestrian appears in front of the vehicle, an onboard camera detects the position of the car or pedestrian ahead, dims the light at only that location, and keeps the high beams shining on the other locations. That is, the shaded area is automatically adjusted out of the area illuminated by the headlights, so as to match the position of the vehicle or person ahead, which keeps the driver of the vehicle ahead or the pedestrian from being blinded by the light. On the other hand, the driver of the vehicle will always have a field of vision that is close to that of driving with the high beams on, so he can easily see pedestrians, road signage, the shape of the road in the distance, and so forth, and this results in safer operation.

The drive substrate disclosed herein can be used for the mounting of various kinds of electrical elements, such as semiconductor elements, light emitting elements, and the like. Also, the light emitting device in which this substrate is used to operate, turning on and off, and otherwise control individual light emitting elements. This light emitting device can be used in an adaptive driving beam headlamp system with which the light distribution pattern and the area to be shaded can be controlled in light emitting element units.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light distribution method for an adaptive driving beam headlamp system including a light emitting device, an on-board camera and an electronic control unit, the light emitting device including:
   a substrate having a first main surface;
   a plurality of first wiring members formed on the first main surface;
   a plurality of second wiring members formed on the first main surface; and
   a plurality of light emitting elements each including a first electrode, a second electrode, and a semiconductor stacked-layer structure, with the first electrode and the second electrode being disposed on the same face side of the semiconductor stacked-layer structure, the first electrode facing and being connected to a corresponding one of the first wiring members, the second electrode having a first connection part and a second connection part electrically connected to each other with electrode material, and the first connection part and the second connection part respectively facing at least two of the second wiring members and bridging the at least two of the second wiring members, the light distribution method comprising:

obtaining data indicative of a state in front of a vehicle by the on-board camera;

computing, based on the data obtained, one or more of: attributes of an object in front of the vehicle; attributes of a vehicle ahead; a speed of the vehicle ahead; a distance between vehicles; brightness of the object; and a road shape;

determining a light distribution pattern based on a computed data;

determining a control amount indicative of at least one of an ON or OFF state of each of the light emitting elements and an applied power to each of the light emitting elements according to the light distribution pattern determined; and controlling driving of the adaptive driving beam headlamp system based on the control amount determined.

2. The light distribution method according to claim 1, wherein the determining of the light distribution pattern includes selecting one of a high-beam light distribution pattern, a focused light distribution pattern, a diffused light distribution pattern, and a low-beam light distribution pattern.

3. The light distribution method according to claim 1, wherein a series of steps of the light distribution method is repeated at a prescribed interval.

4. The light distribution method according to claim 1, wherein the obtaining of the data indicative of the state in front of a vehicle includes obtaining one or more of: an image of an area in front of the vehicle, the vehicle speed, the distance between the vehicles, the road shape, and the light distribution pattern.

5. The light distribution method according to claim 1, wherein the attributes of the object in front of the vehicle includes whether the object is a signal light or a street lamp, the attributes of the vehicle ahead include whether the vehicle ahead is an oncoming vehicle, a vehicle driving ahead or a pedestrian, and the road shape includes at least one of a lane width and whether the road is a straight road.

6. The light distribution method according to claim 1, wherein the first electrode is connected to the corresponding one of the first wiring members via a stud bump or a solder ball, or the second electrode is connected to the corresponding one of the second wiring members via the stud bump or the solder ball.

7. The light distribution method according to claim 1, wherein the second electrode surrounds the first electrode, and surfaces of the first electrode and the second electrode are located at the same height.

8. The light distribution method according to claim 1, wherein each of the first wiring members has a region that faces the second electrode, and an insulating protective film is formed on a surface of each of the first wiring members in the region or on a surface of the second electrode in the region.

9. The light distribution method according to claim 1, further comprising a reflective member in contact with side surfaces of the light emitting elements.

10. The light distribution method according to claim 1, wherein the plurality of light emitting elements is drive-controlled independently of each other.

11. The light distribution method according to claim 1, wherein the first wiring members and the second wiring members are made of the same metal material.

12. The light distribution method according to claim 1, wherein the substrate is a ceramic substrate with a single-layer structure.

13. The light distribution method according to claim 1, wherein the first wiring members and the second wiring members are arranged in a regular pattern in column and row directions.

14. The light distribution method according to claim 1, wherein at least one of the first wiring members or at least one of the second wiring members has a part that is partially branched.

15. The light distribution method according to claim 1, wherein at least one of the second wiring members is wider than at least one of the first wiring members.

16. The light distribution method according to claim 1, wherein the first wiring members extend in a first direction;

the second wiring members extend in a second direction, each of the second wiring members being segmented into a plurality of sections; and the light emitting elements are aligned along the second direction, the at least two of the second wiring members are separated from each other with respect to the second direction.

17. An adaptive driving beam headlamp system comprising:

an on-board camera configured to obtain data indicative of a state in front of a vehicle;

a light emitting device including:

a substrate having a first main surface;

a plurality of first wiring members formed on the first main surface;

a plurality of second wiring members formed on the first main surface; and a plurality of light emitting elements each including a first electrode, a second electrode, and a semiconductor stacked-layer structure, with the first electrode and the second electrode being disposed on the same face side of the semiconductor stacked-layer structure, the first electrode facing and being connected to a corresponding one of the first wiring members, the second electrode having a first connection part and a second connection part electrically connected to each other with electrode material, and the first connection part and the second connection part respectively facing at least two of the second wiring members and bridging the at least two of the second wiring members; and an electronic control unit configured to:
- compute, based on the data obtained, one or more of: attributes of an object in front of the vehicle; attributes of a vehicle ahead; a speed of the vehicle ahead; a distance between vehicles; brightness of the object; and a road shape;
- determine a light distribution pattern based on a computed data;
- determine a control amount indicative of at least one of an ON or OFF state of each of the light emitting elements and an applied power to each of the light emitting elements according to the light distribution pattern determined; and
- control driving of the adaptive driving beam headlamp system based on the control amount determined.

* * * * *